US011039541B2

(12) United States Patent
Fima et al.

(10) Patent No.: US 11,039,541 B2
(45) Date of Patent: *Jun. 15, 2021

(54) DOUBLE-SIDED AND MULTILAYERED PRINTED CIRCUIT BOARD FABRICATION USING INKJET PRINTING

(71) Applicants: NANO-DIMENSION TECHNOLOGIES, LTD., Nes Ziona (IL); THE IP LAW FIRM OF GUY LEVI, LLC, Wyckoff, NJ (US)

(72) Inventors: Sharon Fima, Moshav Neta'im (IL); Hila Elimelech, Moshav Avigdor (IL)

(73) Assignee: Nano Dimension Technologies, LTD., Nes Ziona (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/527,038

(22) PCT Filed: Nov. 22, 2015

(86) PCT No.: PCT/US2015/062046
§ 371 (c)(1),
(2) Date: May 16, 2017

(87) PCT Pub. No.: WO2016/077844
PCT Pub. Date: May 19, 2016

(65) Prior Publication Data
US 2019/0098771 A1 Mar. 28, 2019

Related U.S. Application Data

(60) Provisional application No. 62/080,364, filed on Nov. 16, 2014.

(51) Int. Cl.
*H05K 3/46* (2006.01)
*B33Y 80/00* (2015.01)
(Continued)

(52) U.S. Cl.
CPC ............ *H05K 3/4664* (2013.01); *B33Y 80/00* (2014.12); *B41M 3/006* (2013.01); *C09D 11/101* (2013.01); *C09D 11/107* (2013.01); *C09D 11/30* (2013.01); *C09D 11/52* (2013.01); *H05K 1/097* (2013.01); *H05K 3/0055* (2013.01); *H05K 3/125* (2013.01); *H05K 3/4682* (2013.01); *H05K 3/207* (2013.01); *H05K 2201/0257* (2013.01); *H05K 2203/013* (2013.01)

(58) Field of Classification Search
USPC .................................. 427/97.1, 98.4
See application file for complete search history.

(56) References Cited

U.S. PATENT DOCUMENTS 4,412,015 A * 10/1983 Lustgarten ............. A61K 6/083
106/467
4,986,850 A * 1/1991 Iwata ..................... C09D 11/16
106/217.6
(Continued)

*Primary Examiner* — Brian K Talbot
(74) *Attorney, Agent, or Firm* — Guy Levi; The IP Law Firm of Guy Levi, LLC

(57) ABSTRACT

The disclosure relates to methods, kits and compositions for direct printing of double-sided and/or multilayered printed circuit boards. Specifically, the disclosure relates to the printing of conductive leads and insulating portions of printed circuit boards using inkjet printing.

16 Claims, 2 Drawing Sheets

(51) Int. Cl.
*B41M 3/00* (2006.01)
*C09D 11/101* (2014.01)
*C09D 11/107* (2014.01)
*C09D 11/30* (2014.01)
*C09D 11/52* (2014.01)
*H05K 1/09* (2006.01)
*H05K 3/00* (2006.01)
*H05K 3/12* (2006.01)
*H05K 3/20* (2006.01)

(56) References Cited

U.S. PATENT DOCUMENTS

| | | | |
|---|---|---|---|
| 10,385,175 B2 * | 8/2019 | Elimelech | C08G 59/46 |
| 2006/0132428 A1 * | 6/2006 | Liu | G02F 1/167 |
| | | | 345/107 |
| 2007/0128855 A1 * | 6/2007 | Cho | H05K 3/4664 |
| | | | 438/637 |
| 2008/0311285 A1 * | 12/2008 | Hirai | H05K 3/4069 |
| | | | 427/97.2 |
| 2012/0236064 A1 * | 9/2012 | Iftime | C09D 11/36 |
| | | | 347/20 |
| 2013/0081568 A1 * | 4/2013 | Happoya | H05K 3/022 |
| | | | 118/58 |

* cited by examiner

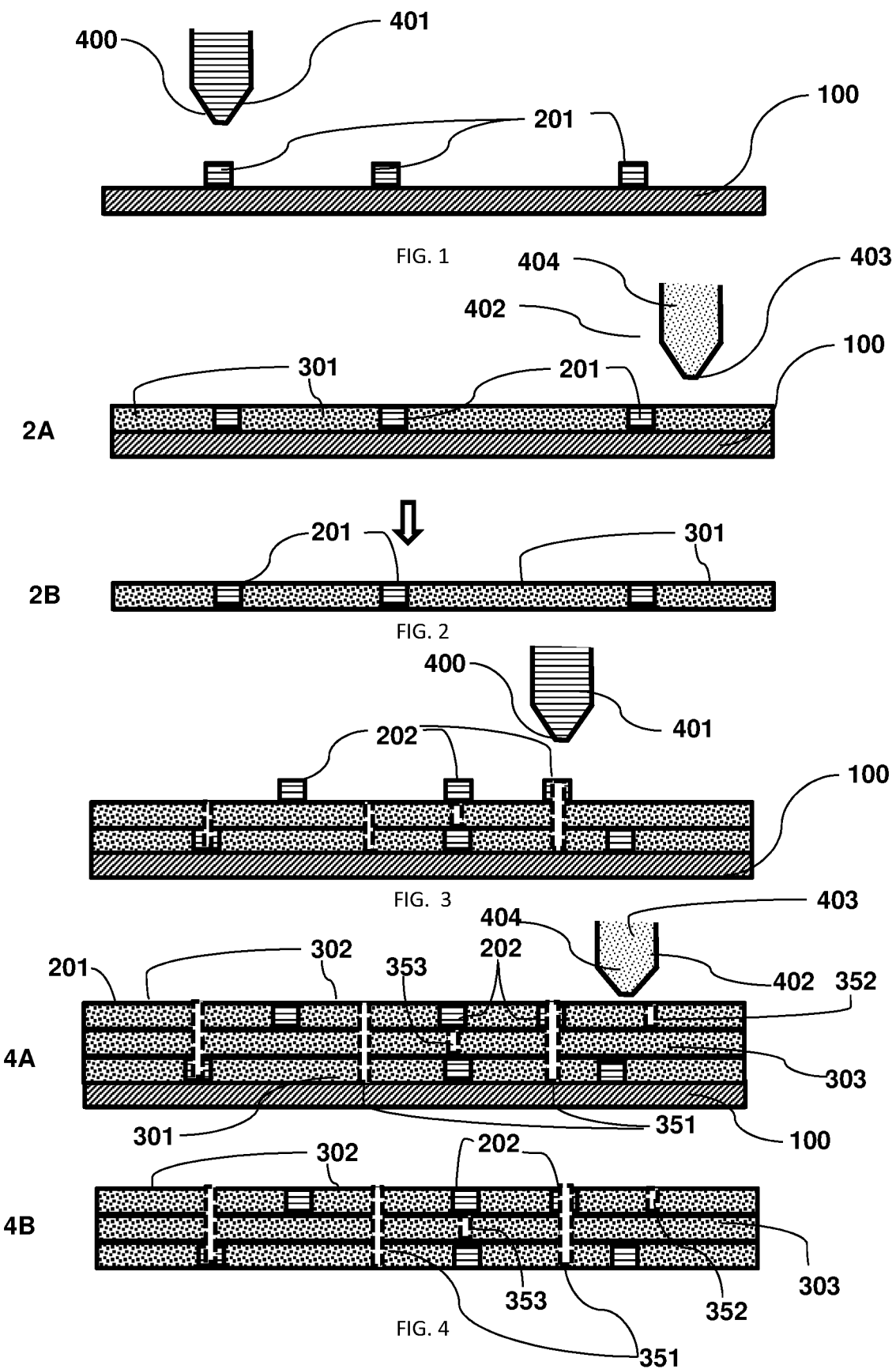

DOUBLE-SIDED AND MULTILAYERED PRINTED CIRCUIT BOARD FABRICATION USING INKJET PRINTING

BACKGROUND

The disclosure is directed to methods and compositions for direct printing of double-sided and/or multilayered printed circuit boards. Specifically, the disclosure is directed to the printing of conductive leads and insulating portions of printed circuit boards using inkjet printing.

The recent trend toward miniaturization of electric products has brought about integration of electronic devices, for example, semiconductors. As a result, there is a need for the fabrication of slim and highly-integrated printed circuit boards (PCBs). Printed circuit boards are generally fabricated by lithography using extractive methods, for example etching. Such a fabrication method provides formation of conductive lines by placing a conductive film on a substrate and etching an unnecessary portion of the conductive film to dissolution-remove a portion of the conductive film, where there are not circuits, with a corrosion solution and thereby to leave only necessary conductive lines.

In addition, in order to improve integration, multi-layered printed circuit boards, and/or double sided printed circuit boards may be required. Current fabrication of multi-layered printed circuit boards require complicated processes including drilling to form through or via holes in order to enable conduction between multilayer boards, laminating the boards and soldering to adhere elements to the printed circuit board. When soldering is performed in order to adhere elements to the printed circuit board, a region, where a solder is melted and spread, is further required and the elements are thus located in an area wider than the size of elements, themselves, thus limiting miniaturization.

Thus there is a need for materials devices and methods enabling efficient and precise fabrication of complex circuit boards.

SUMMARY

Disclosed, in various embodiments, are methods of forming printed circuit boards (PCB's) using inkjet printing, as well as embodiments of inkjet ink compositions facilitating the fabrication of the PCB's.

In an embodiment provided herein is an inkjet printing method for continuously forming a printed circuit board (PCB) comprising: providing a removable (peelable) substrate; providing an ink jet printing system comprising: a first print head having: at least one aperture, a first ink reservoir, and a first pump configured to supply the first inkjet ink through the aperture; a second print head having: at least one aperture, a second ink reservoir, and a second pump configured to supply the second inkjet ink through the aperture; and a conveyor, operably coupled to the first print head and to the second print head, configured to convey the removable substrate to the first and second print head; providing a first inkjet conductive ink composition; using the first inkjet ink, forming a first circuit pattern on the removable substrate; curing the first circuit pattern; providing a second inkjet ink composition configured to form a reinforced thermoset, insulating board; using the second inkjet ink, forming a reinforced thermoset board on the removable substrate on all exposed areas of the removable substrate not occupied by the first circuit pattern; curing the second inkjet ink; and removing the removable substrate, wherein the first circuit pattern and the thermoset reinforced board form a substantially flat, continuous surface.

In an embodiment, the second inkjet ink composition can be a suspension comprising: a plurality of porous particulates impregnated with embedded monomer, oligomer, polymer, or a combination comprising the foregoing, wherein the monomer, oligomer, polymer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; a continuous phase comprising: a cross-linking agent, a co-monomer, a co-oligomer, co-polymer or a composition comprising one or more of the foregoing, wherein the cross-linking agent, co-monomer, co-oligomer, co-polymer or a combination thereof are entirely embedded within the particulates and configured to leach out of the secondary porous particulate at a temperature of between about 60° C. and about 150° C.

Likewise, the second ink composition can be a suspension comprising: a continuous phase; a plurality of porous particulates impregnated with embedded monomer, oligomer, polymer, or a combination comprising the foregoing, wherein the monomer, oligomer, polymer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; and a cross-linking agent, a co-monomer, a co-oligomer, co-polymer or a composition comprising one or more of the foregoing forming a solution, a suspension, or an emulsion within the continuous phase.

In another embodiment, the second (insulating) insulating ink composition can comprise a suspension composition comprising: a dispersed phase comprising a plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; and a continuous phase comprising: multifunctional acrylate monomer, oligomer, polymer or their combination; a cross-linking agent; and a radical photoinitiator, wherein the monomer, oligomer, polymer or their combination impregnated in the porous particulates is partially soluble in the continuous phase and/or is thermodynamically incompatible with a material forming the particulates.

In yet another embodiment, before removing the removable substrate, the method further comprises: using the second inkjet ink, forming an insulating layer on the continuous surface formed by the previous (or more, depends on the number of layers) circuit pattern and the thermoset, board forming insulating portion formed in the areas not occupied by the first circuit pattern, curing the insulating layer, using the first inkjet ink, forming a second circuit pattern on the insulating layer; curing the second circuit pattern; using the second inkjet ink, forming a reinforced thermoset board on the exposed areas of the insulating layer not occupied by the second circuit pattern; and curing the second inkjet ink, wherein the second circuit pattern and the thermoset reinforced board form a substantially flat, continuous surface. And so on till a multilayer having the predetermined number of layers is achieved.

In an embodiment, provided herein is a kit for fabricating a printed circuit board using an inkjet printer comprising: a first inkjet ink composition comprising a plurality of metal nanoparticles having area average diameter $D_{2,1}$ particle size of between about 20 nm and about 150 nm; a dispersant, and a solvent; and optionally other additives. a second inkjet ink composition comprising: plurality of primary porous particulates impregnated with embedded monomer, oligomer, polymer or a combination comprising the foregoing, wherein the monomer, oligomer, polymer or a combination thereof has a first terminal end coupled to the porous particulate and a second, functional terminal end, wherein the monomer, oligomer, polymer, or their combination that is operably coupled to the porous particulates are embedded within the particulates and configured to leach out of the porous particulate at a temperature of between about 60° C. and about 150° C.; a continuous phase comprising: multifunctional acrylate monomer, oligomer, polymer or their combination; a cross-linking agent; and a radical photoinitiator, wherein the monomer, oligomer, polymer or their combination impregnated in the porous particulates is partially soluble in the continuous phase and/or is thermodynamically incompatible with a material forming the particulates; packaging; and optionally instructions or alternatively providing the cross-linking agent in the dispersion itself and not encapsulated within the secondary particles.

Further, provided herein are embodiments of double sided and multi-layered printed circuit boards fabricated using the method and kits described herein.

These and other features of the methods, compositions and kits for using inkjet printing for fabricating double sided and/or multilayered PCB's with embedded circuit(s), will become apparent from the following detailed description when read in conjunction with the figures and examples, which are exemplary, not limiting.

BRIEF DESCRIPTION OF THE FIGURES

For a better understanding of the methods, compositions and kits for using inkjet printing for fabricating double sided and/or multilayered PCB's with embedded circuit(s), with regard to the embodiments thereof, reference is made to the accompanying examples and figures, in which:

FIG. 1 illustrates front elevation aspect of an embodiment of the printing of the first conductive circuit pattern;

FIG. 2, illustrates (FIG. 2A) printing of the reinforced, thermoset insulating board of the first circuit pattern of FIG. 1, and the resulting X-Z Front elevation view of the double sided PCB (FIG. 2B) following the removal of the substrate;

FIG. 3, illustrates front elevation aspect of an embodiment of the printing of another conductive circuit pattern on top of the first conductive circuit pattern;

FIG. 4 illustrates (FIG. 4A) printing of the reinforced, thermoset insulating board of the additional circuit pattern of FIG. 3, and the resulting X-Z front elevation view of multilayered PCB (FIG. 4B) following the removal of the substrate;

DETAILED DESCRIPTION

Figure 5:
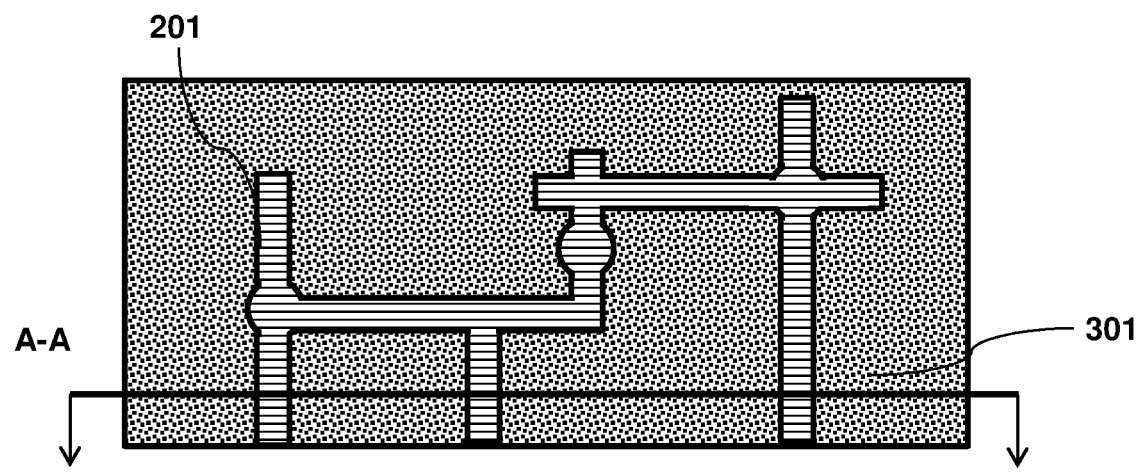
FIG. 5 illustrates an embodiment of the resulting top plan view of embedded circuit pattern of the double sided PCB illustrated in FIG. 2B.

Provided herein are embodiments of methods, compositions and kits for using inkjet printing device for fabricating double sided and/or multilayered PCB's with embedded circuit(s).

The methods described herein can be used to form the printed circuit board (PCB) in a continuous process using the inkjet printing device, or using several passes. Using the methods described herein, the thermoset material used to form the board, which is typically formed separately and provided as a substrate for further printing of the conductive and insulating layers on top of it, is eliminated and, using the methods and compositions described herein, better control over the embedded conductive layer is achieved.

Accordingly and in an embodiment, provided herein is an inkjet printing method for continuously forming a printed circuit board (PCB) comprising: providing a removable (e.g., peelable) substrate; providing an ink jet printing system comprising: a first print head having: at least one aperture, a first ink reservoir, and a first pump configured to supply the first inkjet ink through the aperture; a second print head having: at least one aperture, a second ink reservoir, and a second pump configured to supply the second inkjet ink through the aperture; and a conveyor, operably coupled to the first print head and to the second print head, configured to convey the removable substrate to the first and second print head; providing a first inkjet conductive ink composition; using the first inkjet ink, forming a first circuit pattern on the removable substrate; curing the first circuit pattern; providing a second inkjet ink composition configured to form a reinforced thermoset, insulating board; using the second inkjet ink, forming a reinforced thermoset board on the removable substrate on all exposed areas of the removable substrate not occupied by the first circuit pattern; curing the second inkjet ink; and removing the removable substrate, wherein the first circuit pattern and the thermoset reinforced board form a substantially flat, continuous surface.

The term "peelable" refers in an embodiment to materials that can be removably applied to and adhere to surfaces such as the surface created by the method, compositions and kits for forming PCBs described herein and can be subsequently removed from that surface by force. Peelable films according to the compositions and methods of this invention can be adhesively and removably applied to a chuck disposed on a printer's conveyor belt and, by virtue of being forcibly removed, expose the PCB and in embodiments where the PCB fabricated is a double sided PCB, expose the leads. In order to achieve this activity, the peelable substrate (e.g., a film) of the methods, compositions and kits for forming PCBs described herein can have an adhesive force of at least about 5 to about 25 ounces ("oz."). For example, the peelable films of the method, compositions and kits for forming PCBs described herein should not have such high adhesive force that they cause disruption to the outer layer of the PCB and thereby damage the PCB.

The term "forming" (and its variants "formed", etc.) refers in an embodiment to pumping, injecting, pouring, releasing, displacing, spotting, circulating, or otherwise placing a fluid or material (e.g., the conductive ink) in contact with another material (e.g., the substrate, or another layer) using any suitable manner known in the art.

The method of forming the PCB's can comprise a step of providing a peelable substrate (e.g., a film). The print head (and derivatives thereof; are to be understood to refer to any device or technique that deposits, transfers or creates material on a surface in a controlled manner) depositing the first ink can be configured to provide the ink droplet(s) upon demand, in other words, as a function of various process parameters such as conveyor speed, desired conductive layer thickness, layer type and the like. The removable or peelable substrate can also be a relatively rigid material, for example, glass or crystal (e.g., sapphire), Alternatively, the peelable substrate may be a flexible (e.g., rollable) substrate (or film) to allow for an easy peeling of the substrate from the PCB, for example, poly(ethylenenaphthalate) (PEN), polyimide (e.g. KAPTONE® by DuPont), silicon polymers, poly(ethyleneterphtalate) (PET), poly(tetrafluoroethylene) (PTFE) films etc.

Likewise, other functional heads may be located before, between or after the first print head and/or the second print head These may include a source of electromagnetic radiation configured to emit electromagnetic radiation at a predetermined wavelength ($\lambda$), for example, between 190 nm and about 400 nm, e.g. 365 nm which in an embodiment, can be used to accelerate and/or modulate and/or facilitate a photopolymerizable dispersant that can be used on conjunction with metal nanoparticles used in the conductive ink. Other functional heads can be heating elements, additional printing heads with various inks (e.g., pre-soldering connective ink, label printing of various components for example capacitors, transistors and the like) and a combination of the foregoing. In addition, all printing heads and the method of forming the PCB can be configured to take place in a housing having controlled atmosphere therein. It should be noted, that in circumstances where the removable substrate is transparent (and any subsequent layer is likewise transparent) the electromagnetic radiation source can be optionally positioned below the substrate as well as above the substrate.

Other similar functional steps (and therefore means for affecting these steps) may be taken before or after the first or second print heads (e.g., for curing the conductive layer). These steps may include (but not limited to): a heating step (affected by a heating element, or hot air); photobleaching (using e.g., a UV light source and a photo mask); drying (e.g., using vacuum region, or heating element); (reactive) plasma deposition (e.g., using pressurized plasma gun and a plasma beam controller); cross linking (e.g., by selectively initiated through the addition of a photoacid such as {4-[(2-hydroxytetradecyl)-oxyl]-phenyl}-phenyliodonium hexafluoro antimonate to a polymer solutions prior to coating or used as dispersant with the metal precursor or nanoparticles); annealing, or facilitating redox reactions. Accordingly, in an embodiment, the steps of using the first print head and depositing the first conductive inkjet ink onto the substrate, thereby forming a first printed circuit pattern (see e.g., FIG. 5) layer and/or the step of using the second print head—depositing the second, thermoset insulating and board forming inkjet ink onto the removable substrate, is preceded, followed or takes place concurrently with a step of heating, photobleaching, drying, depositing plasma, cross linking, annealing, facilitating redox reactions, or a combination of steps comprising one or more of the foregoing.

The method of applying the first ink-jet conductive ink composition, the second, insulating and board forming inkjet ink composition or both, can be done using other coating methods, without departing from the scope of the present disclosure. These coating methods can be, for example, jetting, spin coating, roll coating, spray coating, dip coating, flow coating, doctor blade, dispensing, ink-jet printing, offset printing, screen printing, pad printing, gravure printing, flexography printing, stencil printing, imprinting, xerography, and lithography. It is noted, that the method chosen can be dependent, among other factors, on the physical form of the ink-jet ink(s) physical state (e.g., solution, suspension, emulsion or powder), and whether the required action is coating, depositing or patterning the conductive layer(s) onto the substrate. For example, depositing methods used for liquid ink compositions can be; drop casting, spin coating, doctor blade, dip coating, layer-by-layer Langmuir Blodgett, or spray coating and a combination of the foregoing. Likewise, deposition methods for powder forms of the ink-jet ink compositions can be, for example; vacuum thermal evaporation, organic vapor phase deposition (OVPD), organic molecular beam deposition (OMBD), or a combination of the foregoing. In an embodiment, the first ink composition and the second ink composition have the same or different state (e.g., liquid, solid). In addition, patterning methods that can be used with the ink compositions provided, can be, for example; ink-jet printing, soft lithography and the like.

Formulating the first inkjet conductive ink composition, may take into account the requirements, if any, imposed by the deposition tool (e.g., in terms of viscosity and surface tension of the composition, for example when using a silver paste, a carbon paste, a copper paste, conductive polymeric material or a combination comprising one or more of the foregoing) and the surface characteristics (e.g., hydrophilic or hydrophobic, and the surface energy of the peelable or removable substrate) of the removable substrate. Using ink-jet printing with a piezo head, the viscosity of either the first ink-jet conductive ink and/or the second thermoset insulating and board forming inkjet ink (measured at 20° C.) can be, for example, not lower than about 5 cP, e.g., not lower than about 8 cP, or not lower than about 10 cP, and not higher than about 30 cP, e.g., not higher than about 20 cP, or not higher than about 15 cP. The first inkjet conductive ink, can each be configured (e.g., formulated) to have a dynamic surface tension (referring to a surface tension when an ink-jet ink droplet is formed at the print-head aperture) of between about 25 mN/m and about 35 mN/m, for example between about 29 mN/m and about 31 mN/m measured by maximum bubble pressure tensiometry at a surface age of 50 ms and at 25° C. The dynamic surface tension can be formulated to provide a contact angle with the peelable substrate or the insulating layer(s) of between about 100° and about 165°.

Using a conductive paste composition in the methods of fabricating PCB's as described herein, can be composed essentially of conductive copper, silver, or aluminum nanoparticles, a binder, and a solvent, wherein the diameter, shape and composition ratio of the nanoparticles in the ink are optimized, thus enabling the formation of a layer, or printed circuit having a high aspect ratio and exhibiting superior electrical properties. These particles can be in a size range suitable for electronic chemical applications, where flexible conductive circuit lines are typically at least twice as thick as the constituting conductive nanoparticles. For example a line of 120 nm can be printed with a conductive ink containing 60 nm silver nanoparticles. In an embodiment, conductive circuit pattern formed using silver printed using inks of nanosilver suspensions are significantly enhanced in sintering quality, and wherein the silver nanoparticles have thin or small features with high aspect ratios. In other words, nanoparticles aspect ratio R is substantially (in other words, much) higher than 1 (R>>1). Having the high aspect ratio can create an alignment of the nanoparticles due to, for example, flow orientation of the ink in the direction of motion of the substrate on a chuck. Likewise, the nanoparticles can have hexagonal morphology, cubic morphology, platelet morphology or monomodal spherical morphology configured to form dense packing of the metal nanoparticles (in other words, have a fractional concentration that is equal to or larger than 0.74 (v/v)).

In an embodiment, the ink-jet ink compositions and methods allowing for a continuous or semi-continuous inkjet printing of a PCB can be patterned by expelling droplets of the liquid ink-jet ink provided herein from an orifice one-at-a-time, as the print-head (or the substrate) is maneuvered, for example in two (X-Y) (it should be understood that the print head can also move in the Z axis) dimensions at a predetermined distance above the removable substrate or any subsequent layer. The height of the print head can be changed with the number of layers, maintaining for example a fixed distance. Each droplet can be configured to take a predetermined trajectory to the substrate on command by, for example a pressure impulse, via a deformable piezo-crystal in an embodiment, from within a well operably coupled to the orifice. The printing of the first inkjet conductive ink can be additive and can accommodate a greater number of layers. The ink-jet print heads provided used in the methods described herein can provide a minimum layer film thickness equal to or less than about 3 µm-10,000 µm Similarly, the term "contacting" is used in an embodiment to refer to materials which may be blended, mixed, slurried, dissolved, reacted, treated, or otherwise contacted in some other manner. Therefore, the term "contacting" encompasses the "reacting" of two or more components, and it also encompasses the "mixing" or "blending" of two or more components that do not react with one another.

The removable substrate film or sheet, can be positioned on a conveyor moving at a velocity of between about 5 mm/sec and about 1000 mm/sec. The velocity of the substrate can depend, for example, on the number of print heads used in the process, the number and thickness of layers of the PCB printed, the curing time of the ink, the evaporation rate of the ink solvents, the distance between the print head containing the first ink-jet conductive ink of the metal particles or conductive polymer paste and the second print head comprising the second, thermoset insulating and board forming inkjet ink, and the like or a combination of factors comprising one or more of the foregoing.

In an embodiment, the apparent viscosity of the first ink-jet conductive ink composition, or the second, thermoset insulating and board forming inkjet ink can each be between about 0.1 and about 30 cP·s (mPa·s), for example the final ink formulation can have a viscosity of 8-12 cP·s at the working temperature, which can be controlled. For example, the nano-particles dispersion, solution, emulsion, suspension, hydrogel or liquid composition comprising the foregoing, or the second inkjet ink comprising the thermoset insulating and board forming inkjet ink can each be between about 5 cP·s and about 25 cP·s, or between about 7 cP·s and about 20 cP·s, specifically, between about 8 cP·s and about 15 cP·s.

In an embodiment, the volume of each droplet of the first inkjet conductive ink, and/or the second, thermoset insulating and board forming inkjet ink, can range from 0.5 to 300 picoLiter (pL), for example 1-4 pL and depended on the strength of the driving pulse and the properties of the ink. The waveform to expel a single droplet can be a 10V to about 70 V pulse, or about 16V to about 20V, and can be expelled at frequencies between about 5 kHz and about 500 kHz.

The second, insulating and board forming inkjet ink composition used in the methods and kits described herein can be a suspension comprising: a plurality of porous particulates impregnated with embedded monomer, oligomer, polymer or a combination comprising the foregoing, wherein the monomer, oligomer, polymer or a combination thereof has a first terminal end coupled to the porous particulate and a second, functional terminal end, wherein the monomer, oligomer, polymer, or their combination that is operably coupled to the porous particulates are embedded within the particulates and configured to leach out of the porous particulate at a temperature of between about 60° C. and about 150° C. The compositions described herein can have in addition, a continuous phase comprising: a cross-linking agent, a co-monomer, a co-oligomer, co-polymer or a composition comprising one or more of the foregoing, wherein the cross-linking agent, co-monomer, co-oligomer, co-polymer or a combination thereof are embedded within the particulates and configured to leach out of the secondary porous particulate at a temperature of between about 60° C. and about 150° C. Likewise, the oligomer and/or polymer backbone can be induced to form cross links by contacting the polymer with an agent that will form free radicals on the backbone, thereby allowing for cross-linking sites.

In an embodiment, the cross-linking agent, co-monomer, co-oligomer, co-polymer or a composition comprising one or more of the foregoing can be a part, or configured to form a solution, emulsion, gel or suspension within the continuous phase.

In an embodiment, the continuous phase used in the PCBs fabricated using the disclosed methods can comprise: multifunctional acrylate monomer, oligomer, polymer or their combination; a cross-linking agent; and a radical photoinitiator, wherein the monomer, oligomer, polymer or their combination impregnated in the porous particulates is partially soluble in the continuous phase and/or is thermodynamically incompatible with a material forming the particulates.

Accordingly and in another embodiment, the second, insulating portion ink can comprise a suspension of porous particulates impregnated with a monomer, an oligomer, a polymer or a combination comprising the foregoing, wherein the monomer, oligomer, polymer or a combination thereof has a first terminal end coupled to the porous particulate and a second terminal end having for example, an epoxy functionality, wherein the monomer, oligomer, polymer, or their combination that is operably coupled to the porous particulates are entirely embedded within the particulates and configured to leach out of the porous particulate at a temperature of between about 60° C. and about 150° C. The monomer, oligomer, or polymer used in the insulating compositions described herein can have other functional groups as the terminal end of the polymer. Likewise, the oligomer and/or polymer backbone impregnated in the porous particulates can be induced to form cross links by contacting the polymer with an agent that will form free radicals on the backbone, thereby allowing for cross-linking sites.

Initiating the resin backbone can be done using an initiator, for example benzoyl peroxide (BP) and other peroxide-containing compounds. The term "initiator" as used herein generally refers to a substance that initiates a chemical reaction, specifically any compound which initiates polymerization, or produces a reactive species which initiates polymerization, including, for example and without limitation, co-initiators and/or photoinitiator(s).

In another embodiment, the continuous phase comprises active components of a polymer capable of undergoing photoinitiation using a photoinitiator. Such live monomer, live oligomer, live polymer or their combination capable of undergoing photoinitiation can be for example, multifunctional acrylates, for example a multifunctional acrylate that can be multifunctional acrylate is selected from the group consisting of 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl) isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate.

Photoinitiators that can be used with the multifunctional acrylates described herein can be, for example radical photoinitiator. These radical photoinitiators can be, for example Irgacure® 500 from CIBA SPECIALTY CHEMICAL and Darocur® 1173, Irgacure® 819, Irgacure® 184, TPO-L (ethyl(2,4,6, trimethyl benzoil) phenyl phosphinate) benzophenone and acetophenone compounds and the like. For example, the radical photoinitiator can be cationic photoinitiator, such as mixed triarylsulfonium hexafluoroantimonate salts. Another example of the radical photoinitiator used in the active continuous phase described herein, can be 2-ispropylthioxanthone.

In an inactivated state, the monomer, oligomer, polymer, or their combination is embedded within porous particulates (e.g., beads) and upon heating, or activation, the monomer, oligomer, polymer (whether live or not) or their combination partially leaches out of the porous particulates. Accordingly, the monomer, oligomer, polymer, or their combination is not coupled to the porous particulates by surface modification or surface functionalization of the porous particulates, but rather, through internal modification i.e., physical linkage. Under these circumstances, it is possible to provide the suspension in combination with a curing agent, or a cross-linking agent, a live, or active co-monomer, co-oligomer, co-polymer or a composition comprising one or more of the foregoing, without thermosetting the mixture. Moreover, by embedding the monomer, oligomer, polymer, or their combination inside the porous particulate used for reinforcing the resin, the reinforcement particulates become integral to the resin polymer or co-polymer's backbone.

In addition, live, or active co-monomer, co-oligomer, co-polymer or a composition comprising one or more of the foregoing, can likewise be impregnated and embedded within a plurality of particulates, that can be the same or different as the particulates impregnated with the monomer, oligomer or polymer forming the resin's backbone. In other words, by entrapping, for example, the cross linking agent within particulates of the same or different material at predetermined concentrations that, depending on the resin-forming monomers, oligomers or polymers and their combination, both particles can be used in a single ink composition and only upon heating or exposure to a swelling agent, release the entrapped components for reacting and forming the resin. Final properties of the board-forming, insulating portion of the PCB can be tightly control by proper election of various factors, such as, for example:

a. type of monomer used (e.g., bisphenol —F);
b. average weight number MW of the resin-forming polymer/oligomer;
c. concentration within the primary particulate (W/W);
d. Primary particulates concentration (in other words, the particulates that, in an embodiment, are impregnated with the resin monomer (e.g., bisphenol-A)) in the ink (w/w)
e. Type of primary particulates (e.g., silica, mica etc.);
f. Primary particulates formation process (e.g., control pore size, etc);
g. type of cross-linking agent used (e.g., diethylene triamine);
h. average weight number MW of the cross-linking polymer/oligomer;
i. concentration and type of cross-linking agent within the continuous phase (W/W);
j. type and concentration of multifunctional acrylate monomer, oligomer, polymer or their combination;
k. concentration and type of the radical photoinitiator.

The terms "live monomer", "live oligomer", "polymer" or their counterparts (co-monomer e.g.) combination refers in an embodiment to a monomer, a short group of monomers or a polymer having at least one functional group capable of forming a radical reaction (in other words, the reaction can be continued and is not otherwise terminated by an end-group). Likewise, the term "embedded", as used for example in connection with the monomer, oligomer, polymer, or their combination being embedded within the mesoporous particulates, is intended to mean that the embedded material is dispersed within the particulate of the mesoporous particulates as may be accomplished, for example, by blending the monomer, oligomer, polymer, or their combination with the materials used to prepare the, for example mesoporous particulate before it is formed into an particulate, e.g., a bead. For example, the live monomer, live oligomer, live polymer or their combination can be combined under certain circumstances with tetraethoxysilane (TEOS) to form mesoporous particle with the live monomer, live oligomer, polymer or their combination, entrapped within the particulate matter. The term "embedded" excludes live monomer, live oligomer, polymer or their combination applied (as in functionalized) to the surface of a preformed particulate of mesoporous material, or live monomer, live oligomer, polymer or their combination material that has been applied to the surface of a preformed particulate of mesoporous material and allowed to be adsorbed to an area just below the surface of a preformed particulate of mesoporous material, as for example by applying ink to the surface of the preformed matrix (dipping). (According to the IUPAC definition, "micropores" are of a diameter<2 nm, "mesopores" have a diameter within the interval of 2-50 nm and "micropores" are of a diameter>50 nm). Also, in an embodiment, the term "entrapped" refers to the retention for a period of time of the live monomer, live oligomer, live polymer or their combination in the interstitial free volume ($V_f$) of the silica (or other material used to form the porous particulates).

Likewise, the second ink composition can be a suspension comprising: a continuous phase; a plurality of porous particulates impregnated with embedded monomer, oligomer, polymer, or a combination comprising the foregoing, wherein the monomer, oligomer, polymer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; and a cross-linking agent, a co-monomer, a co-oligomer, co-polymer or a composition comprising one or more of the foregoing forming a solution, a suspension, or an emulsion within the continuous phase.

Activation of the monomer, oligomer, polymer or their combination (whether live or not), and thus allowing contact between the live monomer, live oligomer, polymer, or their combination and, for example, a cross-linking agent to initiate curing, can be caused by increase in the interstitial free volume ($V_f$) of the particulates, resulting from the heating either alone, or in the presence of a swelling agent present in the continuous phase of the composition. The mechanism may be (without limitation) such that the heat increases the viscosity of the polymer encapsulated within the silica particles and their kinetic energy, once the $V_f$ is larger than the critical segment length of the polymer, oligomer or monomer or their combination, the polymer can begin to flow within the particulate which, in turn can cause the polymer chains to leach out.

Further, the term "impregnate" means for example, to fill throughout or to saturate the porous, or mesoporous particulates with the monomer, oligomer, polymer, or their combination. For example, the porous particulate is impregnated with the live monomer, live oligomer, or polymer or a combination thereof in a concentration of between about 5% and about 80% weight of the monomer, oligomer, polymer, or their combination per weight of the particulate (w/w).

The amount of monomer, oligomer, polymer, or their combination (whether live or not), the porous particulates are impregnated with will change with the desired physic-chemical characteristic of the board, film or sheet sought to be formed. The monomer, oligomer, polymer or a combination thereof has a number average molecular weight ($\overline{MW_n}$), in other words the average number of monomers per chain of between 1 and about 2000.

Again, here we go into a detailed description of one option for the insulating ink, I am not convinced that we should put so much emphasis on this here. For example, the porous particulates can be impregnated with a monomer, an oligomer, a polymer or a combination comprising the foregoing, wherein the monomer, oligomer, polymer or a combination thereof has a first terminal end coupled to and embedded in the porous (e.g., microporous or mesoporous) particulate and a second, live terminal end having, for example epoxy functionality containing an active (live) oxirane structure represented by the formula 1:

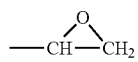

(1)

which is commonly referred to as an "epoxy" functionality. Liquid epoxy resins can be converted through these reactive epoxy sites into tough, insoluble, and infusible solids.

Epoxy resin used herein can be derived from the reaction of a dihydroxy compound of the structure represented by formula 2:

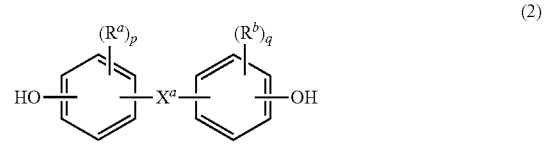

(2)

wherein $R^a$ and $R^b$ each represent a halogen or $C_{1-12}$ alkyl group and can be the same or different; p and q are each independently integers of 0 to 4; and $X^a$ is a single bond, —O—, —S—, —S(O)—, —S(O)$_2$—, —C(O)—, or a $C_{1-18}$ organic group; and epichlorohydrin is (2,2-bis[4-(2'3' epoxy propoxy) phenyl] propane).

Exemplary dihydroxy compounds can be the following: 4,4'-dihydroxybiphenyl, 1,6-dihydroxynaphthalene, 2,6-dihydroxynaphthalene, bis(4-hydroxyphenyl)methane, bis(4-hydroxyphenyl)diphenylmethane, bis(4-hydroxyphenyl)-1-naphthylmethane, 1,2-bis(4-hydroxyphenyl)ethane, 1,1-bis(4-hydroxyphenyl)-1-phenylethane, 2-(4-hydroxyphenyl)-2-(3-hydroxyphenyl)propane, bis(4-hydroxyphenyl) phenylmethane, 2,2-bis(4-hydroxy-3-bromophenyl) propane, 1,1-bis(hydroxyphenyl)cyclopentane, 1,1-bis(4-hydroxyphenyl)cyclohexane, 1,1-bis(4-hydroxyphenyl) isobutene, 1,1-bis(4-hydroxyphenyl)cyclododecane, trans-2,3-bis(4-hydroxyphenyl)-2-butene, 2,2-bis(4-hydroxyphenyl)adamantine, (alpha, alpha'-bis(4-hydroxyphenyetoluene, bis(4-hydroxyphenyl)acetonitrile, 2,2-bis(3-methyl-4-hydroxyphenyl)propane, 2,2-bis(3-ethyl-4-hydroxyphenyl)propane, 2,2-bis(3-n-propyl-4-hydroxyphenyl)propane, 2,2-bis(3-isopropyl-4-hydroxyphenyl)propane, 2,2-bis(3-sec-butyl-4-hydroxyphenyl)propane, 2,2-bis(3-t-butyl-4-hydroxyphenyl)propane, 2,2-bis(3-cyclohexyl-4-hydroxyphenyl)propane, 2,2-bis(3-allyl-4-hydroxyphenyl)propane, 2,2-bis(3-methoxy-4-hydroxyphenyl)propane, 2,2-bis(4-hydroxyphenyl)hexafluoropropane, 1,1-dichloro-2,2-bis(4-hydroxyphenyl)ethylene, 1,1-dibromo-2,2-bis(4-hydroxyphenyl)ethylene, 1,1-dichloro-2,2-bis(5-phenoxy-4-hydroxyphenyl)ethylene, 4,4'-dihydroxybenzophenone, 3,3-bis(4-hydroxyphenyl)-2-butanone, 1,6-bis(4-hydroxyphenyl)-1,6-hexanedione, ethylene glycol bis (4-hydroxyphenyl)ether, bis(4-hydroxyphenyl)ether, bis(4-hydroxyphenyl) sulfide, bis(4-hydroxyphenyl)sulfoxide, bis (4-hydroxyphenyl)sulfone, 9,9-bis(4-hydroxyphenyl) fluorine, 2,7-dihydroxypyrene, 6,6'-dihydroxy-3,3,3',3'-tetramethylspiro(bis)indane ("spirobiindane bisphenol"), 3,3-bis(4-hydroxyphenyl)phthalide, 2,6-dihydroxydibenzo-p-dioxin, 2,6-dihydroxythianthrene, 2,7-dihydroxyphenoxathin, 2,7-dihydroxy-9,10-dimethylphenazine, 3,6-dihydroxydibenzofuran, 3,6-dihydroxydibenzothiophene, and 2,7-dihydroxycarbazole, resorcinol, substituted resorcinol compounds such as 5-methyl resorcinol, 5-ethyl resorcinol, 5-propyl resorcinol, 5-butyl resorcinol, 5-t-butyl resorcinol, 5-phenyl resorcinol, 5-cumyl resorcinol, 2,4,5,6-tetrafluoro resorcinol, 2,4,5,6-tetrabromo resorcinol, or the like; catechol; hydroquinone; substituted hydroquinones such as 2-methyl hydroquinone, 2-ethyl hydroquinone, 2-propyl hydroquinone, 2-butyl hydroquinone, 2-t-butyl hydroquinone, 2-phenyl hydroquinone, 2-cumyl hydroquinone, 2,3, 5,6-tetramethyl hydroquinone, 2,3,5,6-tetra-t-butyl hydroquinone, 2,3,5,6-tetrafluoro hydroquinone, 2,3,5,6-tetrabromo hydroquinone, and the like, as well as combinations comprising at least one of the foregoing dihydroxy compounds.

Specific examples of bisphenol compounds that can be represented by formula (2) can be, for example also; 1,1-bis(4-hydroxyphenyl)methane, 1,1-bis(4-hydroxyphenyl)ethane, 2,2-bis(4-hydroxyphenyl)propane (hereinafter "bisphenol A" or "BPA"), 2,2-bis(4-hydroxyphenyl) butane, 2,2-bis(4-hydroxyphenyl)octane, 1,1-bis(4-hydroxyphenyl)propane, 1,1-bis(4-hydroxyphenyl)n-butane, 2,2-bis(4-hydroxy-1-methylphenyl)propane, 1,1-bis(4-hydroxy-t-butylphenyl)propane, 3,3-bis(4-hydroxyphenyl) phthalimidine, 2-phenyl-3,3-bis(4-hydroxyphenyl) phthalimidine (PPPBP), and 1,1-bis(4-hydroxy-3-methylphenyl)cyclohexane (DMBPC). Combinations comprising at least one of the foregoing dihydroxy compounds can also be used.

When the dihydroxy compound is, for example; bisphenol-A, the resin is commonly called the diglycidyl ether of bisphenol A (DGEBA) and can be represented by the structure of formula 3:

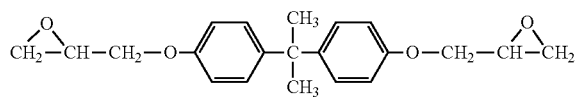

(3)

Higher number of dihydroxy compound (e.g., bisphenol-A units), forming higher molecular weight homologs can be represented by the theoretical structure in formula 4:

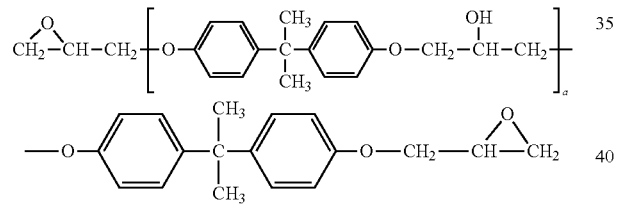

(4)

wherein n, the integer number of repeating units of diglycidyl ether of the dihydroxy compound that the resin was derived from (e.g., DGEBA) can be between 0.1 and about 2000 repeating units.

The number 'n (an average number) of DGE-Dihydroxy, as well as the type of dihydroxy compound, can be used to predetermine (in other words, design) the physico-chemical characteristic of the reinforced board/film/sheet (BFS) formed using the compositions and methods described herein. For example, the repeating unit is DGEBA and n, is on average between about 2 and about 1000, or between about 10 and about 20, specifically between about 10 and about 200, or between about 5 and about 50, more specifically, between about 1 and about 25, or between about 15 and about 25 DGEBA repeating units.

Increase in weight and number average molecular weight the hydroxy groups on the backbone (enol) introduce an additional reactive site, which can react at higher temperatures with anhydrides, organic acids, amino resins, and phenolic resins, or with epoxide groups (when catalyzed) to give additional cross-linking sites.

Initiating the resin backbone can be done using an initiator, for example benzoyl peroxide (BPO) and other peroxide-containing compounds. The term "initiator" as used herein generally refers to a substance that initiates a chemical reaction, specifically any compound which initiates polymerization, or produces a reactive species which initiates polymerization, including, for example and without limitation, co-initiators and/or photoinitiator(s).

The cross linking agent used in the compositions, kits and methods described herein, for forming a reinforced thermoset insulating portion of the PCB can be, for example, a primary or secondary polyamine and adducts thereof, or in another example, an anhydride, a polyamide, a $C_4$-$C_{30}$ polyoxyalkylene in which the alkylene groups each independently comprise 2 to 6 carbon atoms, or a composition comprising one or more of the foregoing.

Primary amine compounds used can be, for example, aliphatic amine compounds having the general structure represented by formula 5:

$$(Et)_n(NH)_{n+1} \quad (5)$$

where Et is the ethylene units and NH are the amine units and wherein n is an integer between 2 and 6.

Primary amines can be, for example, ethylene diamine, diethylene triamine, triethylene tetramine, tetraethylene pentamine. Adducts of the above amines can also be used with epoxy resins, diluents, or other amine-reactive compounds. In addition, aromatic amines, such as, for example; meta-phenylene diamine and diamino diphenyl sulfone, can also be used to achieve higher heat distortion tolerance temperatures. With aromatic amines the activation temperature employed at which the embedded live monomer, live oligomer, polymer or a combination thereof impregnating the porous (e.g., microporous or mesoporous) particulate is adapted or configured to leach out of the porous particulate, for example, silica beads, can be elevated, for example between about 70° C. and about 150° C.

The reaction of a primary amine with an epoxy can be represented by the structure of formula 6:

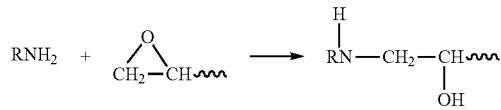

(6)

The reaction can result with a secondary amine that can react further and form the general structure represented by formula 7:

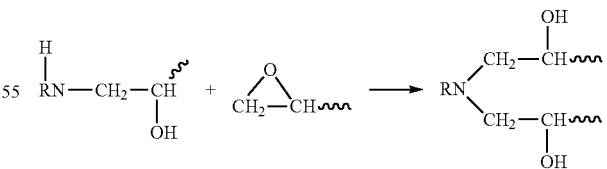

(7)

In an embodiment, and since most aromatic polyamines are solids they could be incorporated as part of the suspension and be selected with a melting temperature that is comparable to the activation temperature enabling the leaching of the live epoxy terminal end of the embedded monomers and oligomers embedded in the impregnated porous particulates under these circumstances, pot life and therefore control can be considerably longer than with aliphatic polyamines, whereby elevated temperature cures are used to develop optimum physic-chemical properties.

Likewise, solid anhydrides can be used to cure epoxy resins and used in a similar manner as aromatic amines. Reaction involves keto-enol reactions among the keto groups on the anhydride and secondary hydroxyl on the resin forming polymer. The initial reaction is an esterification, followed by interesterificaion. At low temperature cures, the ether and ester reactions typically take place at about the same rate. However, at higher temperatures, the ester linkage occurs more frequently, accordingly, when elevated temperatures are used, for example, to leach out the monomer or oligomer, polymer and their combination, choice of n repeating units may be designed to provide the desired properties.

The porous particulates used in the compositions, kits and methods described herein, for forming a reinforced thermoset insulating portion of the PCB can be, porous silica beads having mean diameter ($D_{3,2}$) of between about 10 nm and about 1000 nm. $D_{2,1,}$ refers to the average area assuming a circle divided by the average diameter assuming a circle, of a representative sample of particulates. Using this measure may be important since the embedded monomer, oligomer, polymer or a combination thereof impregnating the microporous, or mesoporous particulates and the particulates are to be incorporated into the resin backbone, rather than reside as fillers among the resin's cured polymerized chains.

Furthermore, the active medium component of the continuous phase, or in other words, the portion of the continuous phase capable of interacting with the leached live monomer, live oligomer, live polymer or their combination, (as described in the methods provided), can have a fractional concentration of between about 80% and 100% of the continuous phase. The percent fractional concentration of the active medium component in the continuous phase, can be a factor of the desired layer thickness of the insulating and reinforced resin portion of the printed circuit board. For example, the higher the concentration of the fractional concentration of the active medium component in the continuous phase, the thinner is the layer formed. The insulating portion of the PCB can therefore form over a period of, for example, between about 0.1 seconds and about 5 seconds.

Moreover, the suspended porous particulates' concentration in the continuous phase used in the compositions, kits and methods described herein, for forming a reinforced thermoset BFS can be equal to or greater than the 2D bond percolation threshold once the embedded monomer, oligomer, polymer or their combination has leached out and below a size-dependent volume concentration conferring on the dispersed phase and the overall composition apparent viscosity of between about 0.1 cP·s and about 30 cP·s before activation.

In an embodiment, the term "percolation" is assigned to the theory of connectivity of particles in randomized lattice structures. Likewise, the term "percolation threshold" is used herein to refer, for example, to a state achieved when a particulate reinforced phase forms a continuous, at least two dimensional (2D) interconnecting network throughout the bulk resin. In other words, the continuous particulate reinforced phase is one where the cross-linked polymer phase is substantially uniformly distributed within the bulk phase.

The porous particulate used in the compositions, kits and methods described herein, for forming a reinforced thermoset insulating portion of the PCB with improved machinability can be, for example, calcium carbonate, or calcium silicate, or a composition comprising one or more of the foregoing. In another example, the porous particulate used in the compositions, kits and methods described herein, for forming a reinforced thermoset insulating portion of the PCB with improved abrasion resistance can be; alumina, flint powder, carborundum, silica, molybdenum disulfide, or a composition comprising one or more of the foregoing; or mica, silica, powdered glass for improved electrical properties.

The suspension may require the presence of a surfactant and optionally a cosurfactants. The surfactants and/or cosurfactants may be cationic surfactants, anionic surfactants, non-ionic surfactant and amphiphilic copolymers, such as block copolymers.

Moreover, the insulating and board forming layer can have a substantially uniform thickness throughout, thereby creating a substantially planar (e.g., flat) surface for receiving an additional conductive circuit pattern. The insulating layer may be an UV curable adhesive or other polymer material. In an embodiment, the insulating ink comprises a UV curable polymer. Other insulating polymers such as, for example, polyester (PES), polyethylene (PE), polyvinyl alcohol (PVOH) and poly-methyl methacrylate (PMMA), Poly(vinylpirrolidone) (PVP, water soluble and may be beneficial not to clog the print head orifice). Other insulating forming materials can be photoresistive polymers, for example, SU-8 based polymers. or their combination and copolymers can also be used as insulating polymers in the compositions methods And kits for forming PCBs described herein.

Depending on the material used in the peelable substrate, using an aqueous dispersion on top of a water soluble polymer film forming the peelable surface may not be feasible. In those circumstances, deposition of an insulating material in a non-polar solvent can be done, for example Poly(4-vinylphenol) dissolved in 1-methyl-2-pyrrolidin). Alternatively, Poly(vinylflouride) (PVF, PVDF) and/or polyamides could also possibly have the potential to serve as an inkjet printable insulator The methods described herein can also be used to form a multi-layered PCB, for example, before removing the removable substrate, the method further comprises: using the second inkjet ink, forming an insulating layer on the continuous surface formed by the first circuit pattern and the thermoset, board forming insulating portion formed in the areas not occupied by the first circuit pattern, curing the insulating layer, using the first inkjet ink, forming a second circuit pattern on the insulating layer; curing the second circuit pattern; using the second inkjet ink, forming a reinforced thermoset board on the exposed areas of the insulating layer not occupied by the second circuit pattern; and curing the second inkjet ink, wherein the second circuit pattern and the thermoset reinforced board form a substantially flat, continuous surface. Additionally, in the various stages (or steps) of forming the first, second or other circuit patterns, forming the reinforced thermoset board on the all exposed areas not occupied by the circuit patterns, forming an insulating layer, the first printhead, the second printhead or both can be used to form microvia(s). The term "microvia" refers in an embodiment to the aspect ratio of a hole, in other words, the ratio of the length or depth of a hole to its diameter. Accordingly, in the PCBs formed integrally (in other words, with no additional step like lasering or drilling) by the methods, compositions microvia refers to through holes, blind holes and buried holes having an aspect ratio between pad diameter (or circuit width at the hole) of equal to or greater than 1.5. For example, using the first printhead, the second printhead or both, the hole can have a blind hole diameter of between about 25 and 75 µm, or 50 µm, with a pad diameter (see e.g., element 250 FIG. 6) of between about 30 µm and about 150 µm, for example, 100 µm. The via holes can be, for example a through via hole (spanning the whole width of the multi-layered PCB), a buried via hole (not exposed to any surface), a blind via hole (exposed to one side only) or a combination of the foregoing. The thickness of each layer can be between about 3 µm and about 1 cm per layer. For example, layers comprising printed circuits can be about 100 µm thick, while insulating layer(s) can be about 25 µm thick.

In another embodiment, the methods described herein can also be used to form a single sided, multi-layered PCB, for example, the steps may comprise providing a peelable substrate wherein the substrate is disposed in a chuck having heating elements coupled thereto (the same chuck can clearly be used in all embodiments of the methods described herein); providing an ink jet printing system comprising: a first print head having: at least one aperture, a first ink reservoir, and a first pump configured to supply the first inkjet ink through the aperture; a second print head having: at least one aperture, a second ink reservoir, and a second pump configured to supply the second inkjet ink through the aperture; and a conveyor, operably coupled to the first print head and to the second print head, configured to convey the chuck with the peelable substrate to the first and second print head; providing a second insulating inkjet ink composition; forming an insulating layer on the peelable substrate; curing, annealing, or solidifying the insulating layer; providing a first inkjet conductive ink composition; using the first inkjet ink, forming a first circuit pattern on the insulating layer; curing the first circuit pattern; providing the second inkjet ink composition; using the second inkjet ink, forming an insulating board atop the insulating layer, on all exposed areas of the insulating layer not occupied by the first circuit pattern; curing the second inkjet ink; using the second inkjet ink, forming another insulating layer atop the continuous surface formed by the first circuit pattern and the insulating portion formed in the areas not occupied by the first circuit pattern, curing the insulating layer, using the first inkjet ink, forming a second circuit pattern on the insulating layer; curing the second circuit pattern; using the second inkjet ink, forming a reinforced thermoset board on the exposed areas of the insulating layer not occupied by the second circuit pattern; and curing the second inkjet ink, wherein the second circuit pattern and the insulating portion form a substantially flat, continuous (e.g., plannar) surface; and removing the peelable substrate, thereby forming a single sided, multi-layer PCB. Additionally, in the various stages (or steps) of forming the first, second or other circuit patterns, forming the insulating layer on the all exposed areas not occupied by the circuit patterns, forming an insulating layer, the first printhead, the second printhead or both can be used to form microvia(s). A person skilled in the art would readily recognize that the process of forming the insulating layer, printing an additional circuit pattern followed by printing an insulating portion in the areas not otherwise occupied by the conductive circuit patterns and so on, can be repeated as needed to form as many layers as practicable and desired.

In an embodiment, provided herein is a inkjet printing method for forming a double-sided printed circuit board (PCB) comprising: providing a peelable substrate; providing an ink jet printing system comprising: a first print head having: at least one aperture, a first ink reservoir, and a first pump configured to supply the first inkjet ink through the aperture; a second print head having: at least one aperture, a second ink reservoir, and a second pump configured to supply the second inkjet ink through the aperture; and a conveyor, operably coupled to the first print head and to the second print head, configured to convey the peelable substrate to the first and second print head; providing a first inkjet conductive ink composition; using the first inkjet ink, forming a first circuit pattern on the removable substrate; curing the first circuit pattern; providing a second inkjet ink composition wherein the second inkjet ink composition is a suspension comprising: a continuous phase comprising: a multifunctional acrylate monomer, oligomer, polymer or their combination; a cross-linking agent; and a radical photoinitiator; and a suspended (in other words, dispersed) phase comprising plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C. and wherein the monomer, oligomer, polymer or their combination impregnated in the porous particulates is partially soluble in the continuous phase and/or is thermodynamically incompatible with a material forming the particulates. The second ink composition can be configured to form a reinforced thermoset, insulating board; then, using the second inkjet ink, forming an insulating portion on the removable substrate on all exposed areas of the removable substrate not occupied by the first circuit pattern.

The step of forming an insulating portion on the insulating layer on all exposed areas of the insulating layer not occupied by the first circuit pattern comprises: jetting the second ink composition; leaching a portion of the monomer, oligomer, polymer or a combination thereof from the porous particulates; contacting the leached monomer, oligomer, polymer or a combination thereof with the cross-linking agent, wherein the cross-linking agent is configured to activate the radical photoinitiator; using the activated the radical photoinitiator, exposing the continuous phase to electromagnetic radiation configured to initiate radical formation in the multifunctional acrylate monomers, oligomers, polymers or their combination; and reacting the monomer, oligomer or a combination thereof from the porous particulates with the cross-linking agent and the radicalized multifunctional acrylate monomers, oligomers, polymers or their combination.

Curing the second inkjet ink can then take place on the reacted active components and the polymer, oligomers or their combination that were leached out of the porous (e.g., silica) particulates; followed by removing the peelable substrate, wherein the first circuit pattern and the insulating portion of the PCB form a substantially planar surface.

In an embodiment, the methods for forming or fabricating multi-layered or double layered PCB using inkjet printer described herein, can be facilitated using the kits provided herein. Accordingly, provided is a kit for fabricating a printed circuit board using an inkjet printer comprising: a first inkjet ink composition comprising the conductive ink compositions described herein; a second inkjet ink composition comprising the insulating inkjet ink described herein; optionally packaging; optionally other functional additives, for example, viscosity modifiers, dispersants, UV stabilizers, solvents and the like; and optionally instructions.

A more complete understanding of the components, methods, and devices disclosed herein can be obtained by reference to the accompanying drawings. These figures (also referred to herein as "FIG.") are merely schematic representations based on convenience and the ease of demonstrating the present disclosure, and are, therefore, not intended to indicate relative size and dimensions of the devices or components thereof, their relative size relationship and/or to define or limit the scope of the exemplary embodiments. Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function. Likewise, cross sections are referred to on normal orthogonal coordinate apparatus having XYZ axis, such that Y axis refers to front-to-back, X axis refers to side-to-side, and Z axis refers to up-and-down.

Turning now to FIGS. 1, 2, and 5, illustrating an embodiment of the method of using inkjet printing device for fabricating a double sided PCB. A shown in FIG. 1, removable or peelable substrate 100 is provided; using an ink jet printing system with a first print head having: at least one aperture 400, a first ink reservoir 401, and a first pump (not shown) configured to supply the first inkjet conductive ink 201 through aperture 400; second print head 402 (See FIG. 2A) having at least one aperture 403, second ink reservoir 404, and a second pump (not shown) configured to supply the second inkjet insulating, thermoset board forming ink 301 through aperture 403; and a conveyor (not shown), operably coupled to first print head 400 and to second print head 402, configured to convey removable substrate 100 to first and second print head 400, 402 respectively. Using first inkjet ink 201 and printing head 400, forming first circuit pattern (see e.g., FIG. 5) on removable substrate 100; curing the first circuit pattern. After the curing, as illustrated in FIG. 2B, second inkjet ink 301 composition, which can be configured to form a reinforced thermoset, insulating board is provided. Using second inkjet ink 301 and second printing head 402, forming a reinforced thermoset board on removable substrate 100 on all exposed areas of the removable substrate not occupied by the first circuit pattern (See e.g., FIG. 5); curing second inkjet ink 301; and removing removable substrate 100 (see e.g., FIG. 2B), wherein the first circuit pattern and the thermoset reinforced board form a substantially flat, continuous surface as illustrated in FIG. 2B, showing an X-Z cross section A-A of FIG. 5.

Figure 6:
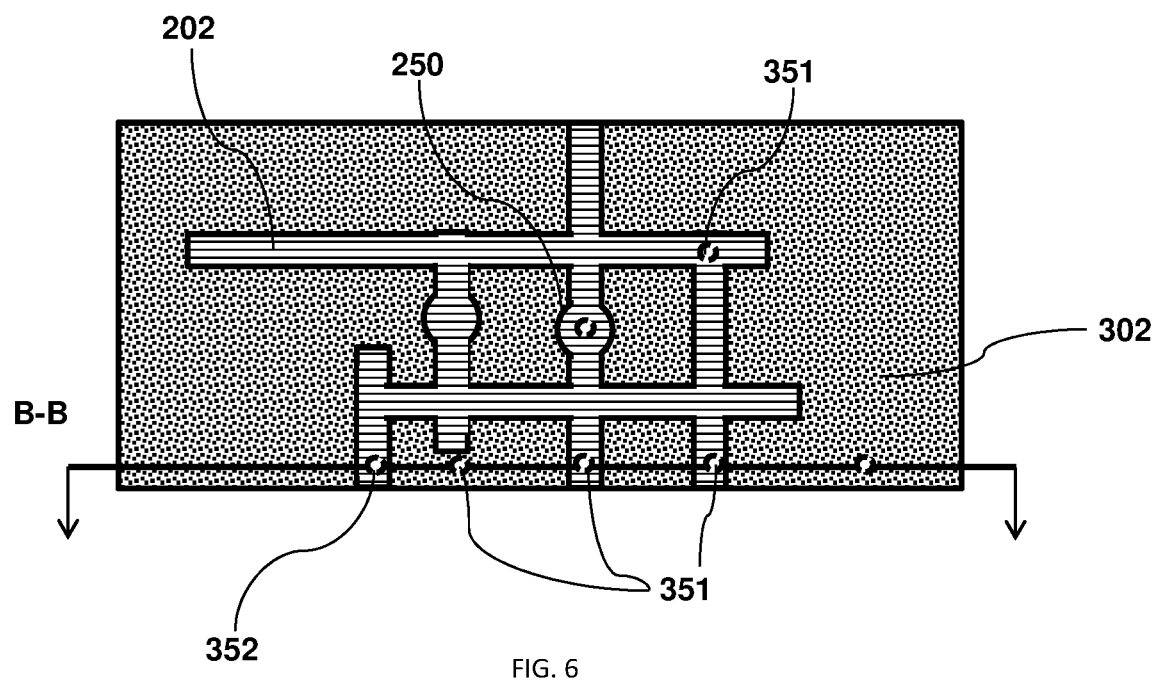
FIG. 6, illustrates an embodiment of the resulting X-Y top plan view of embedded circuit pattern of the multi-layered PCB illustrated in FIG. 4B.

Turning now to FIGS. 3, 4, and 6, illustrating the use of the compositions, methods and kits described herein for forming a multilayer PCB, wherein: before removing removable substrate 100, using second inkjet ink 301 with print head 402, forming an insulating thermoset layer 303 and curing the insulating layer, then, using first inkjet conductive ink 201 in print head 400, forming second circuit pattern (see e.g., FIG. 3, 6) on the first circuit pattern and the thermoset, reinforced board (see e.g., FIG. 5); curing the second circuit pattern. Then, using second inkjet ink 301 and second print head 402, forming a reinforced thermoset board on the exposed areas of the surface formed of the first circuit pattern and the thermoset, reinforced board, not occupied by the second circuit pattern (see e.g., FIG. 4A); curing the second inkjet ink for forming a reinforced thermoset insulating portion of the PCB, wherein the second circuit pattern and the thermoset reinforced board form a substantially flat, continuous surface, as illustrated in FIG. 4B, showing an X-Z cross section B-B of FIG. 6. Then substrate 100 is removed (See e.g., FIG. 4B). In the above described multilayer printed circuit board, via hole 350, for connecting conductor circuits sandwiching board-forming layer 301 can be formed, where via hole 350 can be a penetrating via hole 351 and/or blind via hole 352, or buried via hole 353. As illustrated vias (via for connecting between layers, hole— can contain an electrical component soldered to it) 350 such as through via holes 351 can be included in thermoset, board forming layers 301 Vias 350 can be formed, for example, by normal PCB drilling or lasering techniques, which can be incorporated into the inkjet printer. Using the methods described herein via holes 350, whether penetrating through holes 351, non-through holes, or blind via hole 253 and or buried via holes 353, can be formed using the inkjet printing methods by directly forming the voids through the layers. Following the removal of substrate layer 100, the formed PCBs can then be further stamped, routed, drilled, milled, etched equipped with various electrical elements, e.g. by can soldered to it, or otherwise processed to create passages in conformance with a predetermined circuit board layout. The resulting variety of these passages can become fluidic passages, or wiring passages. Openings in the thermoset, insulating and board forming parts of the PCB can also be formed through lateral cuts which form comparatively large openings, while other areas in the layers may include vias (holes) 350 (see e.g., FIG. 6), such as tent vias (or non-penetrating, $350_j$), through-hole vias, and blind vias.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

All ranges disclosed herein are inclusive of the endpoints, and the endpoints are independently combinable with each other. "Combination" is inclusive of blends, mixtures, alloys, reaction products, and the like. The terms "a", "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, when present, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

All ranges disclosed herein are inclusive of the endpoints, and the endpoints are independently combinable with each other. Furthermore, the terms "first," "second," and the like, herein do not denote any order, quantity, or importance, but rather are used to denote one element from another.

Likewise, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

Accordingly and in embodiment, provided herein is a inkjet printing method for forming a double-sided printed circuit board (PCB) comprising: providing a peelable substrate; providing an ink jet printing system comprising: a first print head having: at least one aperture, a first ink reservoir, and a first pump configured to supply the first inkjet ink through the aperture; a second print head having: at least one aperture, a second ink reservoir, and a second pump configured to supply the second inkjet ink through the aperture; and a conveyor, operably coupled to the first print head and to the second print head, configured to convey the peelable substrate to the first and second print head; providing a first inkjet conductive ink composition; using the first inkjet ink, forming a first circuit pattern on the removable substrate; curing the first circuit pattern; providing a second inkjet ink composition configured to form a reinforced thermoset, insulating board; using the second inkjet ink, forming an insulating portion on the removable substrate on all exposed areas of the removable substrate not occupied by the first circuit pattern; curing the second inkjet ink; and removing the peelable substrate, wherein the first circuit pattern and the thermoset reinforced board form a substantially planar surface, wherein (i) the step of curing the first circuit pattern comprises heating, photobleaching, drying, depositing plasma, cross linking, annealing, facilitating redox reaction, or a combination comprising one or more of the foregoing, wherein (ii) the first inkjet conductive ink composition comprises: metal nanoparticles having area average diameter $D_{2,1}$ particle size between about 20 nm and about 150 nm; a dispersant, and a solvent, (iii) the aspect ratio of the metal nanoparticles is substantially larger than 1, wherein (iv) the first inkjet conductive ink, the second inkjet ink composition or both is a suspension, an emulsion, a duplex emulsion, a gel or a solution comprising one of the foregoing, wherein (v) the second inkjet ink composition is a suspension comprising: a suspended phase comprising a plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; a plurality of secondary particulate comprising: a cross-linking agent, a co-monomer, a co-oligomer, co-polymer or a composition comprising one or more of the foregoing, wherein the cross-linking agent, co-monomer, co-oligomer, co-polymer or a combination thereof are entirely embedded within the particulates and configured to leach out of the secondary porous particulate at a temperature of between about 60° C. and about 150° C.; and a continuous phase, or (vi) the second inkjet ink composition is a suspension comprising: a continuous phase comprising: a multifunctional acrylate monomer, oligomer, polymer or their combination; a cross-linking agent; and a radical photoinitiator; and a suspended phase comprising plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C. and wherein the monomer, oligomer, polymer or their combination impregnated in the porous particulates is partially soluble in the continuous phase and/or is thermodynamically incompatible with a material forming the particulates, the step of forming an insulating portion on the insulating layer on all exposed areas of the insulating layer not occupied by the first circuit pattern comprises: jetting the second ink composition; leaching a portion of the monomer, oligomer, polymer or a combination thereof from the porous particulates; contacting the leached monomer, oligomer, polymer or a combination thereof with the cross-linking agent, wherein the cross-linking agent is configured to activate the radical photoinitiator; using the activated the radical photoinitiator, exposing the continuous phase to electromagnetic radiation configured to initiate radical formation in the multifunctional acrylate monomers, oligomers, polymers or their combination; and reacting the monomer, oligomer or a combination thereof from the porous particulates with the cross-linking agent and the radicalized multifunctional acrylate monomers, oligomers, polymers or their combination, wherein (vii) the porous particulates are porous silica beads having mean diameter ($D_{2,1}$) of between about 10 nm and about 1000 nm, (viii) the porous particulate concentration in the dispersed phase is equal to or greater than the 2D bond percolation threshold and below a size-dependent volume concentration conferring on the ink, an apparent viscosity of between about 0.1 cP·s and about 30 cP·s, wherein (ix) the monomer, oligomer, polymer or a combination thereof has a number average molecular weight ($\overline{MW}_n$) of between 2 and about 2000, (x) the monomer, oligomer, polymer, or a combination thereof is independently derived from a dihydroxy compound of the formula:

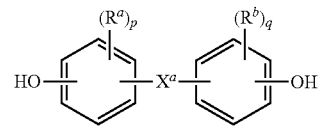

a. wherein $R^a$ and $R^b$ each represent a halogen or $C_{1-12}$ alkyl group and can be the same or different; p and q are each independently integers of 0 to 4; and $X^a$ is a single bond, —O—, —S—, —S(O)—, —S(O)$_2$—, —C(O)—, or a $C_{1-18}$ organic group, (xi) the monomer, oligomer or a combination thereof is independently derived from bisphenol-A, wherein (xii) the multifunctional acrylate is 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl)isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate or a multifunctional acrylate composition comprising one or more of the foregoing, wherein (xiii) the cross linking agent is a primary or secondary amine and adducts thereof, an anhydride, a polyamide, a $C_4$-$C_{30}$ polyoxyalkylene in which the alkylene groups each independently comprise 2 to 6 carbon atoms, or a composition comprising one or more of the foregoing at a concentration (w/w) of between about 0.05% (w/w composition) and about 10% (w/w composition), (xiv) the $C_4$-$C_{30}$ polyoxyalkylene in which the alkylene groups each independently comprise 2 to 6 carbon atoms, is a poly(oxymethylene), poly(oxyethylene), poly (oxypropylene), poly(oxybutylene) or a composition comprising one or more of the foregoing, wherein (xv) the radical photoinitiator is ethyl (2,4,6, trimethyl benzoil) phenyl phosphinate), benzophenone and acetophenone compounds, mixed triarylsulfonium hexafluoroantimonate salts, 2-ispropylthioxanthone or a radical photoinitiator composition comprising one or more of the foregoing present at a concentration of between about 0.01% (w/w composition) and about 8.0% (w/w), wherein (xvi) before removing the removable substrate, further comprising using the second inkjet ink, forming an insulating layer on the continuous surface formed by the first circuit pattern and the insulating portions formed by the second inkjet ink composition; curing the insulating layer using the first inkjet ink, forming a second circuit pattern on the insulating layer; curing the second circuit pattern; using the second inkjet ink, forming insulating portions on the exposed areas of the surface formed by the first circuit pattern and the insulating layer not occupied by the second circuit pattern; and curing the second inkjet ink, wherein the second circuit pattern and the insulating portions form a substantially planar surface and (xvii) further comprising, during the steps of forming the first circuit pattern, the step of forming a reinforced thermoset board on the removable substrate on all exposed areas of the removable substrate not occupied by the first circuit pattern, the step of forming an insulating layer, the step of forming the second circuit pattern and the step of forming a reinforced thermoset board on the exposed areas of the surface formed by the first circuit pattern and the insulating layer not occupied by the second circuit pattern, using the first printhead, the second printhead or both to form a through via hole, a buried via hole, a blind via hole or a combination of the foregoing.

In another embodiment, provided herein is an inkjet printing method for forming a single sided printed circuit board (PCB) comprising: providing a peelable substrate; providing an ink jet printing system comprising: a first print head having: at least one aperture, a first ink reservoir, and a first pump configured to supply the first inkjet ink through the aperture; a second print head having: at least one aperture, a second ink reservoir, and a second pump configured to supply the second inkjet ink through the aperture; and a conveyor, operably coupled to the first print head and to the second print head, configured to convey the removable substrate to the first and second print head providing a first inkjet conductive ink composition; using the second inkjet ink, forming an insulating layer on the peelable substrate; using the first inkjet ink, forming a first circuit pattern on the insulating layer; curing the first circuit pattern; providing a second inkjet ink insulating composition; using the second inkjet ink, forming an insulating portion on the insulating layer on all exposed areas of the insulating layer not occupied by the first circuit pattern; curing the second inkjet ink; and removing the peelable substrate, wherein the first circuit pattern and the insulating portions form a substantially planar surface, wherein (xviii) the step of curing the first circuit pattern comprises heating, photobleaching, drying, depositing plasma, cross linking, annealing, facilitating redox reaction, or a combination comprising one or more of the foregoing, wherein (xix) the first inkjet conductive ink composition comprises: metal nanoparticles having area average diameter $D_{2,1}$ particle size between about 20 nm and about 150 nm; a dispersant, and a solvent, (xx) the aspect ratio of the metal nanoparticles is substantially larger than 1, wherein (xxi) the first inkjet conductive ink, the second inkjet ink composition or both is a suspension, an emulsion, a duplex emulsion, a gel or a solution comprising one of the foregoing, wherein (xxii) the second inkjet ink composition is a suspension comprising: a suspended phase comprising a plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; a plurality of secondary particulate comprising: a cross-linking agent, a co-monomer, a co-oligomer, co-polymer or a composition comprising one or more of the foregoing, wherein the cross-linking agent, co-monomer, co-oligomer, co-polymer or a combination thereof are entirely embedded within the particulates and configured to leach out of the secondary porous particulate at a temperature of between about 60° C. and about 150° C.; and a continuous phase, or (xxiii) the second inkjet ink composition is a suspension comprising: a continuous phase comprising: a multifunctional acrylate monomer, oligomer, polymer or their combination; a cross-linking agent; and a radical photoinitiator; and a suspended phase comprising plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C. and wherein the monomer, oligomer, polymer or their combination impregnated in the porous particulates is partially soluble in the continuous phase and/or is thermodynamically incompatible with a material forming the particulates, the step of forming an insulating portion on the insulating layer on all exposed areas of the insulating layer not occupied by the first circuit pattern comprises: jetting the second ink composition; leaching a portion of the monomer, oligomer, polymer or a combination thereof from the porous particulates; contacting the leached monomer, oligomer, polymer or a combination thereof with the cross-linking agent, wherein the cross-linking agent is configured to activate the radical photoinitiator; using the activated the radical photoinitiator, exposing the continuous phase to electromagnetic radiation configured to initiate radical formation in the multifunctional acrylate monomers, oligomers, polymers or their combination; and reacting the monomer, oligomer or a combination thereof from the porous particulates with the cross-linking agent and the radicalized multifunctional acrylate monomers, oligomers, polymers or their combination, wherein (xxiv) the porous particulates are porous silica beads having mean diameter ($D_{2,1}$) of between about 10 nm and about 1000 nm, (xxv) the porous particulate concentration in the dispersed phase is equal to or greater than the 2D bond percolation threshold and below a size-dependent volume concentration conferring on the ink, an apparent viscosity of between about 0.1 cP·s and about 30 cP·s, wherein (xxvi) the monomer, oligomer, polymer or a combination thereof has a number average molecular weight ($\overline{MW}_n$) of between 2 and about 2000, (xxvii) the monomer, oligomer, polymer, or a combination thereof is independently derived from a dihydroxy compound of the formula:

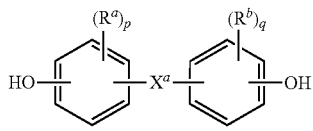

wherein $R^a$ and $R^b$ each represent a halogen or $C_{1-12}$ alkyl group and can be the same or different; p and q are each independently integers of 0 to 4; and $X^a$ is a single bond, —O—, —S—, —S(O)—, —S(O)$_2$—, —C(O)—, or a $C_{1-18}$ organic group, (xxviii) the monomer, oligomer or a combination thereof is independently derived from bisphenol-A, wherein (xxix) the multifunctional acrylate is 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl)isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate or a multifunctional acrylate composition comprising one or more of the foregoing, wherein (xxx) the cross linking agent is a primary or secondary amine and adducts thereof, an anhydride, a polyamide, a $C_4$-$C_{30}$ polyoxyalkylene in which the alkylene groups each independently comprise 2 to 6 carbon atoms, or a composition comprising one or more of the foregoing at a concentration (w/w) of between about 0.05% (w/w composition) and about 10% (w/w composition), (xxxi) the $C_4$-$C_{30}$ polyoxyalkylene in which the alkylene groups each independently comprise 2 to 6 carbon atoms, is a poly(oxymethylene), poly(oxyethylene), poly(oxypropylene), poly(oxybutylene) or a composition comprising one or more of the foregoing, wherein (xv) the radical photoinitiator is ethyl (2,4,6, trimethyl benzoil) phenyl phosphinate), benzophenone and acetophenone compounds, mixed triarylsulfonium hexafluoroantimonate salts, 2-ispropylthioxanthone or a radical photoinitiator composition comprising one or more of the foregoing present at a concentration of between about 0.01% (w/w composition) and about 8.0% (w/w), wherein (xxxii) before removing the removable substrate, further comprising using the second inkjet ink, forming an insulating layer on the continuous surface formed by the first circuit pattern and the insulating portions formed by the second inkjet ink composition; curing the insulating layer using the first inkjet ink, forming a second circuit pattern on the insulating layer; curing the second circuit pattern; using the second inkjet ink, forming insulating portions on the exposed areas of the surface formed by the first circuit pattern and the insulating layer not occupied by the second circuit pattern; and curing the second inkjet ink, wherein the second circuit pattern and the insulating portions form a substantially planar surface and (xxxiii) further comprising, during the steps of forming the first circuit pattern, the step of forming a reinforced thermoset board on the removable substrate on all exposed areas of the removable substrate not occupied by the first circuit pattern, the step of forming an insulating layer, the step of forming the second circuit pattern and the step of forming a reinforced thermoset board on the exposed areas of the surface formed by the first circuit pattern and the insulating layer not occupied by the second circuit pattern, using the first printhead, the second printhead or both to form a through via hole, a buried via hole, a blind via hole or a combination of the foregoing.

The above examples and description have of course been provided only for the purpose of illustration, and are not intended to limit the disclosed technology in any way. As will be appreciated by the skilled person, the disclosed technology can be carried out in a great variety of ways, employing more than one technique from those described above, all without exceeding the scope of the invention.

What is claimed:

1. An inkjet printing method for forming a double-sided printed circuit board (PCB) comprising:
   a. providing a peelable substrate;
   b. providing an ink jet printing system comprising:
      i. a first print head having: at least one aperture, a first ink reservoir, and a first pump configured to supply the first inkjet ink through the aperture;
      ii. a second print head having: at least one aperture, a second ink reservoir, and a second pump configured to supply the second inkjet ink through the aperture; and
      iii. a conveyor, operably coupled to the first print head and to the second print head, configured to convey the peelable substrate to the first and second print head;
   c. providing a first inkjet conductive ink composition;
   d. using the first inkjet ink, forming a first conductive circuit pattern on the peelable substrate;
   e. sintering the first conductive circuit pattern;
   f. providing a second inkjet ink composition configured to form a reinforced thermoset, insulating board wherein the second inkjet ink composition is a suspension comprising:
      i. a continuous phase comprising: a multifunctional acrylate monomer, oligomer, polymer or their combination;
      ii. a cross-linking agent;
      iii. a radical photoinitiator; and
      iv. a suspended phase comprising plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C. and wherein the monomer, oligomer, polymer or their combination impregnated in the porous particulates is partially soluble in the continuous phase and/or is thermodynamically incompatible with a material forming the particulates, wherein the porous particulate concentration in the dispersed phase is equal to or greater than the 2D bond percolation threshold and below a size-dependent volume concentration conferring on the ink, an apparent viscosity of between about 0.1 cPs and about 30 cPs;

g. using the second inkjet ink, forming an insulating portion on the peelable substrate on all exposed areas of the peelable substrate not occupied by the first circuit pattern;

h. curing the second inkjet ink forming an insulating layer; and i. removing the peelable substrate, wherein the first circuit pattern and the thermoset reinforced board form a substantially planar surface.

2. The method of claim 1, wherein the step of curing the second circuit pattern comprises heating, photobleaching, drying, depositing plasma, cross linking, annealing, facilitating redox reaction, or a combination comprising one or more of the foregoing.

3. The method of claim 2, wherein the first inkjet conductive ink composition comprises: metal nanoparticles having area average diameter $D_{2,1}$ particle size between about 20 nm and about 150 nm; a dispersant, and a solvent.

4. The method of claim 3, wherein the aspect ratio of the metal nanoparticles is substantially larger than 1.

5. The method of claim 1, wherein the second inkjet ink composition is a suspension further comprising: a plurality of secondary particulates comprising: a cross-linking agent, a co-monomer, a co-oligomer, co-polymer or a composition comprising one or more of the foregoing, wherein the cross-linking agent, co-monomer, co-oligomer, co-polymer or a combination thereof are entirely embedded within the particulates and configured to leach out of the secondary porous particulate at a temperature of between about 60° C. and about 150° C.

6. The method of claim 1, wherein the step of forming an insulating portion on the insulating layer on all exposed areas of the insulating layer not occupied by the first circuit pattern comprises:

a. jetting the second ink composition;

b. leaching a portion of the monomer, oligomer, polymer or a combination thereof from the porous particulates;

c. contacting the leached monomer, oligomer, polymer or a combination thereof with the cross-linking agent, wherein the cross-linking agent is configured to activate the radical photoinitiator;

d. using the activated radical photoinitiator, exposing the continuous phase to electromagnetic radiation configured to initiate radical formation in the multifunctional acrylate monomers, oligomers, polymers or their combination; and e. reacting the monomer, oligomer or a combination thereof from the porous particulates with the cross-linking agent and the radicalized multifunctional acrylate monomers, oligomers, polymers or their combination.

7. The method of claim 1, wherein the porous particulates are porous silica beads having mean diameter $(D_{2,1})$ of between about 10 nm and about 1000 nm.

8. The method of claim 1, wherein the monomer, oligomer, polymer or a combination thereof has a number average molecular weight $(\overline{MW_n})$ of between 2 and about 2000.

9. The method of claim 8, wherein the monomer, oligomer, polymer, or a combination thereof is independently derived from a dihydroxy compound of the formula:

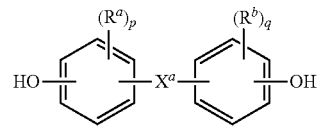

wherein $R^a$ and $R^b$ each represent a halogen or $C_{1-12}$ alkyl group and can be the same or different; p and q are each independently integers of 0 to 4; and $X^a$ is a single bond, —O—, —S—, —S(O)—, —S(O)$_2$—, —C(O)—, or a $C_{1-18}$ organic group.

10. The method of claim 9, wherein the monomer, oligomer or a combination thereof is independently derived from bisphenol-A.

11. The composition of claim 10, wherein the multifunctional acrylate is 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl)isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate or a multifunction a acrylate composition comprising one or more of the foregoing.

12. The method of claim 1, wherein the cross linking agent is a primary or secondary amine and adducts thereof, an anhydride, a polyamide, a $C_4$-$C_{30}$ polyoxyalkylene in which the alkylene groups each independently comprise 2 to 6 carbon atoms, or a composition comprising one or more of the foregoing at a concentration (w/w) of between about 0.05% (w/w composition) and about 10% (w/w composition).

13. The method of claim 12, wherein the radical photoinitiator is ethyl (2,4,6, trimethyl benzoil) phenyl phosphinate), benzophenone and acetophenone compounds, mixed triarylsulfonium hexafluoroantimonate salts, 2-ispropylthioxanthone or a radical photoinitiator composition comprising one or more of the foregoing present at a concentration of between about 0.01% (w/w composition) and about 8.0% (w/w).

14. The method of claim 12, wherein the $C_4$-$C_{30}$ polyoxyalkylene in which the alkylene groups each independently comprise 2 to 6 carbon atoms, is a poly(oxymethylene), poly(oxyethylene), poly(oxypropylene), poly(oxybutylene) or a composition comprising one or more of the foregoing.

15. The method of claim 1, wherein, before removing the peelable substrate, further comprising:

a. using the second inkjet ink, forming an insulating layer on the continuous surface formed by the first circuit pattern and the insulating portions formed by the second inkjet ink composition;

b. curing the insulating layer c. using the first inkjet ink, forming a second circuit pattern on the insulating layer;
d. curing the second circuit pattern;
e. using the second inkjet ink, forming insulating portions on the exposed areas of the surface formed by the first circuit pattern and the insulating layer not occupied by the second circuit pattern; and
f. curing the second inkjet ink, wherein the second circuit pattern and the insulating portions form a substantially planar surface.

16. The method of claim 15, further comprising, during the steps of forming the first circuit pattern, the step of forming a reinforced thermoset board on the peelable substrate on all exposed areas of the peelable substrate not occupied by the first circuit pattern, the step of forming an insulating layer, the step of forming the second circuit pattern and the step of forming a reinforced thermoset board on the exposed areas of the surface formed by the first circuit pattern and the insulating layer not occupied by the second circuit pattern, using the first printhead, the second printhead or both to form a through via hole, a buried via hole, a blind via hole or a combination of the foregoing.

\* \* \* \* \*